United States Patent
Droz (10) Patent No.: US 10,314,216 B2
(45) Date of Patent: Jun. 4, 2019

(54) METHOD OF FABRICATING ELECTRONIC CARDS INCLUDING AT LEAST ONE PRINTED PATTERN

(71) Applicant: Nagravision S.A., Cheseaux-sur-Lausanne (CH)

(72) Inventor: François Droz, Corcelles (CH)

(73) Assignee: Nagravision S.A., Cheseaux-sur-Lausanne (CH)

( * ) Notice: Subject to any disclaimer, the term of this patent is extended or adjusted under 35 U.S.C. 154(b) by 647 days.

(21) Appl. No.: 14/791,606

(22) Filed: Jul. 6, 2015

(65) Prior Publication Data
US 2015/0379386 A1     Dec. 31, 2015

Related U.S. Application Data

(62) Division of application No. 12/526,382, filed as application No. PCT/EP2008/051447 on Feb. 6, 2008, now Pat. No. 9,107,336.

(30) Foreign Application Priority Data

Feb. 9, 2007 (EP) .................................... 07102087

(51) Int. Cl.
*B42D 25/00* (2014.01)
*B42D 25/45* (2014.01)
(Continued)

(52) U.S. Cl.
CPC ............. *H05K 13/00* (2013.01); *B42D 25/00* (2014.10); *B42D 25/45* (2014.10); *B42D 25/485* (2014.10);
(Continued)

(58) Field of Classification Search
CPC .... H05K 13/0023; B42D 25/00; B42D 25/45; B42D 25/485; G06K 19/077; G06K 19/07718
See application file for complete search history.

(56) References Cited

U.S. PATENT DOCUMENTS 4,803,542 A * 2/1989 Haghiri-Tehrani .......................... G06K 19/07745
257/679
4,990,759 A     2/1991 Gloton et al.
(Continued)

FOREIGN PATENT DOCUMENTS

EP     0570784 A1     11/1993
EP     0789323 A2     8/1997
(Continued)

OTHER PUBLICATIONS

International Search Report issued in corresponding application No. PCT/EP2008/051447, completed May 7, 2008 and dated Jun. 3, 2008.
(Continued)

*Primary Examiner* — Hoa C Nguyen
(74) *Attorney, Agent, or Firm* — Oblon, McClelland, Maier & Neustadt, L.L.P.

(57) ABSTRACT

The invention relates to a method for fabricating electronic cards by A) forming a plurality of card bodies in the form of a thick sheet with a plurality of electronic units or modules embedded in the sheet; B) printing a plurality of first patterns on a first face of the thick sheet in a printing station where ink is applied on the first face; C) applying a first at least partially transparent coating on each printed first pattern, that adheres to the card body. The method can also include printing a plurality of second patterns on the inner surface of a film forming the first coating. Preferably, the printing of the first patterns is carried out in an offset type station for
(Continued)

printing high definition patterns, essentially of the security type. The second patterns define personal data. The printed thick sheet defines an intermediate product according to the invention.

2 Claims, 3 Drawing Sheets

(51) Int. Cl.
    *H05K 13/00*     (2006.01)
    *B42D 25/485*     (2014.01)
    *G06K 19/077*     (2006.01)

(52) U.S. Cl.
    CPC ..... *G06K 19/077* (2013.01); *G06K 19/07718* (2013.01)

(56) References Cited

U.S. PATENT DOCUMENTS

| | | |
|---|---|---|
| 5,272,374 A | 12/1993 | Kodai et al. |
| 5,399,847 A | 3/1995 | Droz |
| 5,817,207 A * | 10/1998 | Leighton ............... B32B 37/185 156/298 |
| 6,206,291 B1 | 3/2001 | Droz |
| 6,239,976 B1 | 5/2001 | Templeton et al. |
| 6,467,692 B1 | 10/2002 | Tarantino et al. |
| 6,843,422 B2 | 1/2005 | Jones et al. |
| 7,770,517 B2 | 8/2010 | Ohsawa |
| 2002/0129970 A1 | 9/2002 | Murohara |
| 2003/0226899 A1 | 12/2003 | Finkelstein |
| 2003/0235720 A1* | 12/2003 | Athey .................. C03C 17/002 428/702 |
| 2004/0041262 A1 | 3/2004 | Okamoto et al. |
| 2004/0256466 A1 | 12/2004 | Droz |
| 2004/0256469 A1 | 12/2004 | Faenza et al. |
| 2005/0019989 A1 | 1/2005 | Droz |
| 2007/0004100 A1 | 1/2007 | Maekawa et al. |

FOREIGN PATENT DOCUMENTS

| | | |
|---|---|---|
| WO | 03/056500 A | 7/2003 |
| WO | 03/090151 A | 10/2003 |
| WO | 2004/068395 A | 8/2004 |
| WO | 2004/074000 A | 9/2004 |
| WO | 2004/102469 | 9/2004 |

OTHER PUBLICATIONS

Haghiri, Yahya et al., "7.2 Kontaklose Chipkaret (Laminiertechnik)," Vom Plastik zur Chipkarte, 1999, pp. 181-192.
Finkenzeller, Klaus, "12 Herstellung von Transpondern and kontaklosen Chipkarten," RFID Handbuch, Sep. 26, 2002, pp. 341-351.
International Search Report issued in application PCT/EP2006/00963 completed on Feb. 2, 2007 and dated Mar. 28, 2007.
Office Action issued in related U.S. Appl. No. 12/305,618 dated Feb. 1, 2012.
Office Action issued in related U.S. Appl. No. 13/451,849 dated Jul. 23, 2012.
Final Office Action issued in related U.S. Appl. No. 12/305,577 dated Oct. 24, 2012.
Fundamentals of Machining/Orthogonal Machining, Materials and Processes in Manufacturing 480-81 (9th ed.), 2003.
Notice of Allowance issued in related U.S. Appl. No. 12/305,577 dated May 10, 2013.

\* cited by examiner

METHOD OF FABRICATING ELECTRONIC CARDS INCLUDING AT LEAST ONE PRINTED PATTERN

This is a Divisional Application of Ser. No. 12/526,382, filed Aug. 7, 2009, which is a National Phase Application in the United States of International Patent Application PCT/EP 2008/051447 filed Feb. 6, 2008, which claims priority on European Patent Application No. 07102087.9 of Aug. 7, 2007. The entire disclosures of the above patent applications are hereby incorporated by reference.

FIELD OF THE INVENTION

The present invention concerns the fabrication of electronic cards, i.e. cards that include at least one electronic unit and have any shape or contour. More specifically, the invention concerns the fabrication of electronic cards that have at least one printed pattern, which is protected by an at least partially transparent coating, particularly an overlay.

In a particular implementation of the invention, the fabricated card has patterns printed on both of its two flat surfaces, each printed pattern being protected by an at least partially transparent overlay.

It will be noted that the method according to the invention applies to all types of electronic cards of various thicknesses and also variable dimensions. However, the method according to the invention is particularly efficient and advantageous for fabricating electronic cards that have a relatively small thickness, for example of approximately 0.8 millimeters, such as bank cards or with a smaller thickness.

The present invention concerns in particular cards with high quality printed patterns, for example bank cards or identity cards with a security impression that is difficult to counterfeit.

BACKGROUND OF THE INVENTION

A card fabrication method is known from US Patent No. WO 2004/074000 wherein data writing is performed by a laser beam after the various layers of the card have been assembled. In order to do this, a specific layer that can be laser written is introduced into the card. This method of writing a text or a pattern is limited and requires a relatively long period of time since the laser beam has to follow a line that matches the desired pattern. This method may be used for personalised card writing. However, it cannot be used for making patterns in different colours or that entirely cover a certain surface of the card. Moreover, this technique requires integration of a specific, laser sensitive layer in the card. Thus, this laser writing technique does not fall within the scope of the present invention, which concerns printing techniques with inks deposited on solid layer or sheet surfaces forming fabricated cards.

Figure 1:
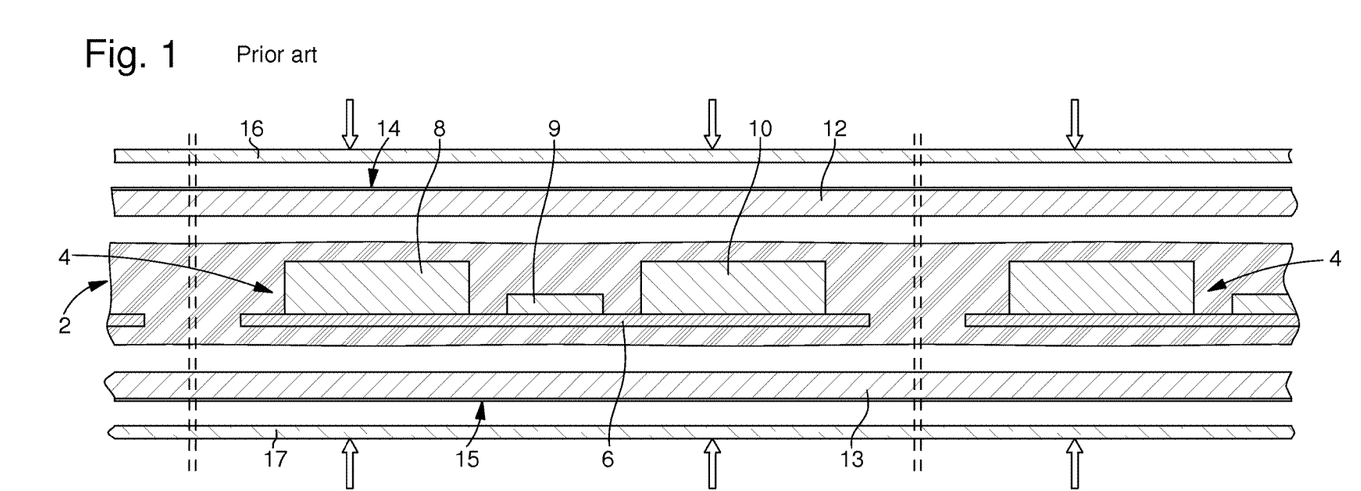
FIG. 1, already described, shows schematically a card fabricating method according to the prior art and including back-to-back printed patterns.

With reference to FIG. 1 annexed to this description, we will describe below the conventional method of fabricating electronic cards that have printed patterns with ink on both sides of the card. Three main steps can be differentiated in this conventional method. First of all, an inlay 2 comprising a plurality of electronic modules 4 is formed. Electronic module 4 is formed of a substrate 6 that carries various electronic elements 8, 9 and 10. It will be noted that the electronic module can be of any type and formed for example of electronic elements that are connected to each other without a substrate. Next, two opaque intermediate layers 12 and 13 are provided, on which first and second patterns 14 and 15 are respectively printed. To obtain high quality prints, the intermediate layers are preferably white. Moreover, to ensure that these intermediate layers remain stable during printing of the first and second patterns, those skilled in the art choose for example PVC layers of sufficient thickness, generally more than 100 microns. To obtain a card with high definition prints, in particular an identity card, those skilled in the art choose intermediate layers that preferably have a thickness of between 120 and 150 microns. Finally, two transparent overlays 16 and 17 are placed on the printed patterns and inlay 2, the two intermediate layers 12 and 13 and the two overlays 16 and 17 are placed in a laminating station (represented by the vertical arrows) to assemble the various layers and thus make a plate defining a plurality of printed electronic cards. The individual cards are obtained by finally cutting in the plate.

The thickness of transparent overlays 16 and 17 is generally between 50 and 100 microns, preferably between 60 and 80 microns.

In the usual case of bank cards with a thickness of between 0.76 and 0.84 mm according to the ISO standard, it is noted the total thickness of the intermediate layers and outer protective layers is up to, for example, 360 microns (0.36 millimeters) when intermediate layers with a thickness of 120 microns and outer layers with a thickness of 60 microns are chosen. Thus, to obtain cards within the aforementioned ISO standard, the inlay comprising the electronic units has to have a thickness of less than 480 microns, namely between 400 and 480 microns.

Since the height of inlay 2 is limited, the height of the electronic elements that can be incorporated in inlay 2 is also limited. If the electronic card incorporates at least one electronic element whose height is for example around 300 microns, the thickness of the material forming the inlay is thus thin above and below the electronic element. It will be noted that it is difficult in these conditions to obtain an inlay that has proper flat surfaces and exhibits homogeneous behaviour in the presence of heat. Thus, during the laminating step of the conventional method described above, the intermediate layers will easily experience local deformations in the areas superposed on the electronic elements. The fact that inlay 2 often has surface waviness requires a relatively large supply of thermal energy to reduce this waviness as much as possible during lamination. Compensation for the waviness and deformations of the inlay under the effect of heat generates deformations in the intermediate layers, which, because of their position in the laminated multi-layers, are softened and easily subjected to deformation, or to being spread out slightly. As these intermediate layers actually receive more thermal energy than the inlay and have a smaller thickness than the inlay, they generally experience the most significant deformation. Given that these intermediate layers 12 and 13 carry the printed patterns, it is easy for the patterns to be damaged during the final laminating step.

It will be noted that the local deformations, in the areas where the electronic elements are located, are generated by the different behaviour of the materials forming inlay 2 in the presence of heat, which affects the surface state of the inlay, given the small thickness of said material in these areas when the electronic elements are close to the surfaces of the inlay. Thus, during the laminating step where thermal energy is supplied for assembling the various layers, the behaviour of the material in the areas where the electronic elements are located and any bumps due to the presence of these electronic elements generate small displacements of material in a localised way in the softened intermediate layers, which then causes the printed patterns to be marked on the intermediate layers. Finally, we will also mention the greater hardness of the electronic elements, which mark the intermediate layers just as easily during lamination as they do when the intermediate layers are located at a short distance from the electronic elements.

The conventional fabrication method described above enables the inlay incorporating the electronic units or modules to be made in presses with flat surfaces, thus preventing the electronic units or modules being bent during manufacture of the cards. Those skilled in the art consider this fact to be an essential element in the electronic card fabrication method, particularly when the electronic units or modules have relatively large dimensions and/or electrical connections between various electronic elements. The inlay or central sheet 2 is thus prevented from being bent or cambered during the entire card fabrication method.

Next, those skilled in the art consider the aforementioned conventional method as appropriate for obtaining high quality printing on both sides of the card. The opaque intermediate layers define a flat surface and a homogenous printing support. Moreover, those skilled in the art consider that it is necessary to use these intermediate layers to receive a high definition printed pattern, in particular when they are using a cylinder printing station, especially of the Offset type. Since the printing support is taut over the cylindrical surfaces of the cylinders, those skilled in the art both fabricate the inlay incorporating the electronic elements one the one hand and make a high quality print on a uniform layer entirely formed by a plastic material, for example a PVC sheet on the other hand. Next, these layers are assembled in a laminating station where the layers are pressed between flat surfaces to be assembled.

It is thus observed that those skilled in the art naturally tend to use homogenous plastic sheets, with a thickness of around 100 to 150 microns, as a support for high quality printing, particularly Offset printing. They know that these sheets behave properly in cylinder printing stations. Thus, they separate forming the inlay incorporating the electronic elements and printing on homogenous, flexible supports. Next, they assemble these layers in a flat technique to obtain electronic cards that have printed patterns visible on both sides of the cards. The intermediate layers used as printing support must preferably have a certain thickness to ensure that the support is stable in the printing station and to limit the spreading of these intermediate layers during the subsequent laminating step.

Thus, as already mentioned, the conventional method used by those skilled in the art has a first drawback, due to the limited thickness of inlay 2; which limits the height of the electronic elements incorporated and generates deformations in the printed intermediate layers when they pass into the hot press used to form the finished card.

Other drawbacks of the conventional method described above will be noted in a non-exhaustive manner. Laminating a multi-layer formed of an inlay with a thickness of less than 500 microns, two intermediate layers each with a thickness of less than 100 microns and two transparent outlays with a thickness of 60 to 80 microns requires the use of a relatively expensive laminating station. Moreover, given that inlay 2 may have slight surface waviness and internal stress it the material of which it is formed, laminating the various layers requires good control of card fabrication method, in particular for adjusting the parameters involved in the method, namely the pressure, temperature and length of the laminating cycle. Given the significant know-how necessary for making high quality cards, the laminating step is preferably performed by a specialist in such techniques. It is therefore to be noted that, in addition to the fact that it is very difficult to obtain cards with high definition printed patterns without local deterioration, fabricating these cards must be performed by a specialised manufacturer if one wishes to obtain high quality cards. Thus, flexibility in the finish of the cards, which one might expect from the separate fabrication of inlays incorporating electronic elements and intermediate layers printed in plastic sheet printing stations, cannot be used in practice. Consequently, it is not really possible to envisage, at least in part, performing the printing and final assembly of the cards elsewhere at a distributor's or card user's.

AIM OF THE INVENTION

It is an object of the present invention to propose a method of fabricating electronic cards that overcomes the various aforementioned drawbacks of the prior art, by proposing a rational solution that provides electronic cards with very high quality printed patterns, particularly high definition patterns, via an efficient method.

It is another object of the invention to provide a card fabricating method that has a high definition security pattern and a personalised pattern that may have less definition; with this method the personalised pattern can easily be printed and the card can easily be finalised at another location to ensure protection of the personalised pattern by adding an at least partially transparent coating.

SUMMARY OF THE INVENTION

The invention therefore concerns a method of fabricating cards that each include at least one electronic unit incorporated or embedded in a card body and at least a first printed pattern on the side of a first surface of the card body, this method including the following steps:

A) Forming a plurality of card bodies in the form of a thick sheet that incorporates or embeds respectively a plurality of electronic units or modules;

B) Printing a plurality of first patterns on a first surface of said thick sheet in a printing station in which ink is deposited on said first surface to form the first patterns;

C) Placing a first at least partially transparent coating on each first printed pattern, said transparent coating adhering to said card body.

In a main implementation mode of this method, a plurality of second patterns are also printed on the second surface of the thick sheet in a printing station, in which ink is deposited on said second surface, and an at least partially transparent coating is placed on each second printed pattern that adheres to said card body. In this case, the first and second coatings, in particular two plastic films, are added simultaneously after the first and second patterns have been printed. The coating may also be formed by a lacquer or transparent ink deposited by transfer from an ink support. In this latter case, the lacquer or transparent ink is preferably deposited directly after each surface has been printed.

According to a preferred variant, the thickness of said thick sheet, which forms the plurality of card bodies incorporating or embedding the respective electronic units or modules, is approximately equal to or greater than two thirds of the final thickness of the fabricated cards. In particular, for cards that have an ISO thickness of between 0.76 and 0.84 mm, the thickness of said thick printed sheet is preferably approximately equal to or greater than 0.60 mm (600 microns) and two external films form the two coatings respectively.

According to a preferred implementation of the method according to the invention, the printing station used for printing said plurality of first patterns on a first surface of the thick sheet is formed of several cylinders used as printing supports. Thus, the thick sheet that incorporates the plurality of electronic units or modules is arranged in succession on the surfaces of the cylinders during the printing step. The thick sheets are thus curved or bent in the printing station, which those skilled in the art generally avoid. In particular, the printing station is an Offset printing station or similar for making high definition prints.

It will be noted that it is possible to provide several successive prints on the surfaces of the thick sheet. For example, first of all a first, high definition pattern is made on the first surface of the thick sheet, particularly a security pattern, i.e. which is difficult to reproduce without implementing significant means. Next, a second print is subsequently made, generally of less definition but not necessarily, in the client's station, directly on the first print or on a fine intermediate layer that is at least partially transparent, arranged on the first print. This second print may define personal data.

It will be noted that the prints that follow the first patterns may be made on the thick sheet on each card body after a step of cutting the card body in the sheet. In this latter case, the coating is added to the printed patterns of each individual card body to finish fabrication in a station card by card.

Generally, in the method according to the invention, or in any batch card fabricating method from a plate or sheet (with or without electronic elements incorporated or embedded in the plate), an advantageous method is provided for individually printing each card and then covering the prints of the card with a plastic overlay of a certain thickness, which is as follows: Each card body, which may or may not include a first printed pattern, is cut out of the plate with an initial contour with greater dimensions than that of the finished card. Next, at least one particular print is printed on each card body and an overlay that has a thickness, for example of 40 to 80 microns, is added on top, with or without a thin resin layer, and assembled card by card in a small press adapted to the larger format of these card bodies. Finally, the final contour of the card is cut out inside said initial contour. This allows individual fabrication of the cards in a second individual phase of the fabrication method, while having a laminated overlay with the card body and a clean card edge with a uniform cut, and thus a high quality card.

The invention also concerns a card fabrication method for cards that each include a least one electronic unit incorporated or embedded in a card body and at least one printed pattern on the side of a first surface of the card body, characterized in that it includes the following steps:

A) Forming a plurality of card bodies in the form of a thick sheet that incorporates or embeds respectively a plurality of electronic units;

B) Printing a plurality of first patterns on a first surface of said thick sheet so that each first pattern is on a different card body;

C) Printing a plurality of second patterns on a surface of a partially transparent film or on a respective plurality of partially transparent films;

D) Arranging said film or said plurality of films on the side of said first surface of said thick sheet, each second pattern being located above a different card body, or, after a step of cutting the card bodies in said thick sheet, said plurality of films on said respective plurality of card bodies, such that the printed surface of the film or films is located on the side of the thick sheet or the printed surface of one part of said film or that of one of said films is located on the side of a respective card body and that said first patterns are at least partially visible through said film or said films, and E) Assembling said thick sheet with said film or said plurality of films or each card body with one part of said film or one of said films.

While keeping the advantages of the invention described above, this method constitutes an improvement that allows complex prints to be performed, in particular of a high definition security pattern forming a general basic print on which or above which a second printed pattern is arranged on a different support, for example a personalised pattern as happens with bank cards or identity cards. This improved fabrication method thus easily allows a personalised pattern and a high definition security pattern, virtually imperceptible to the naked eye, to be superposed.

A "personalised pattern" or "personal data" means any print whose nature varies depending upon what it is destined for, i.e. for a company, a person, an animal or an object. This personalised print may be a number and/or a photo, a logo, a brand, etc.

The step of cutting individual cards may occur prior to step D) or after step E). Steps D) and E) can be almost simultaneous if the film is placed in contact with the card body by the assembly press. Thus, one can work with a plate until the final cutting of the cards or finish the cards one by one by assembling each card body with a respective transparent overlay. One could even envisage a station with a plurality of printed patterns on the same film and each card body (already cut) individually added opposite one part of the film including a printed pattern, which is intended for that card body. Then, for example, a hot press can be used to assemble said part of the film with the individual card body and only then the part of the film is cut therein. Work can thus be continuous using a strip-shaped film, like a photographic film. Preferably, the final contour of each card is cut in each card body, which then has greater dimensions than that of the finished card.

According to a preferred variant, after printing step B), said first printed surface is covered with a protective film or a lacquer so as to protect said first printed patterns, prior to step D).

According a particular first variant, said protective film or said lacquer are arranged in a removable manner on the first printed surface of the thick sheet and are removed prior to step D) where the at least partially transparent film(s) is/are arranged on said first printed surface. These features ensure that the first printed patterns are protected until the moment when the at least partially transparent film(s), including the print of the second patterns, is (are) added above the first printed surface of the thick sheet. This thick sheet can thus be stored and/or transported after printing without any risk of damaging the printed patterns. This is particularly important when the first printed patterns define the high definition security prints.

According to another specific variant, the protective film or lacquer covering the first surface of the thick sheet adheres properly to the sheet and they are selected so as to form an adherence interface between the at least partially transparent film or films and the thick sheet during assembly at step E). The same benefits are thus obtained as in the other specific variant described above, but the protective film or lacquer form part of the fabricated cards and are thus made to be at least partially transparent.

For some particular applications and some markets, particularly the identity card market, the improved method according to the invention means that steps B) and D) can easily be performed in different production sites, which may be located in different countries. Thus, for example, the first printed pattern on the thick sheet defines a general security print requiring expensive equipment and very good control of printing techniques, whereas the second printed pattern on the transparent film defines a personalised print that may have less definition and be printed in a destination country using less expensive means and requiring less know-how.

Advantageously, the improved method according to the invention allows two at least partially transparent overlays to be laminated with the thick sheet, printed on both sides, via a small supply of energy relative to the quantity of energy generally used in step A); which limits deformations of the thick sheet and even prevents any perceptible deformations in the first printed patterns. However, given the greater stability of the printed sheet, one may envisage, in particular, fabrication with a supply of heat, as in the prior art, while obtaining little or no deformation. This should be provided when a stack of plates is arranged in a hot press, to allow the heat to reach the median plates.

As in the method according to the invention first mentioned, surprisingly for those skilled in the art who would not have envisage such a method of fabricating electronic cards with a very high quality printed pattern, in a preferred implementation, the printing station for the first patterns is formed of several cylinders used as printing supports, and the thick sheet incorporating the plurality of electronic units is arranged in series on the surface of these cylinders during the printing step and is thus curved several times in the printing station. Various tests have demonstrated that, surprisingly, electronic units or modules embedded in a relatively flexible thick sheet may, in several cases, pass through a printing station of this type without the electronic units or modules being damaged. When certain electronic elements have significant dimensions, care will be taken to give these elements some flexibility and capacity to deform elastically, if possible. Precautions may be necessary as regards the electric connections and links between the electronic elements. In particular, flexible supports and sliding electric contacts will be preferred, Preferably, the printing station provided for the first patterns is an Offset or similar printing station for making high definition prints.

According to an implementation variant, a plurality of third patterns are also printed on the second surface of the thick sheet in a printing station, and an at least partially transparent coating is placed on each third printed pattern that adheres to the card bodies formed by said thick sheet. Preferably, the first and second films are added and assembled during the same step after the various prints have been performed.

As in the method according to the invention that was first mentioned, in a preferred variant, the thickness of said thick sheet, is approximately equal to or greater than two thirds of the final thickness of the fabricated cards. In the particular case of the bankcards, the thickness of the thick, printed sheet is preferably approximately equal to or greater than 0.60 mm.

Generally, it is possible to provide a thin resin layer that is deposited or arranged on the first, respectively second printed surface of the thick sheet, or on the printed surface of the at least partially transparent film added to one or these two surfaces. This thin resin layer is selected so that it forms an adherence interface between the film and the thick sheet. Generally, this thin resin layer is arranged on the printed pattern. However, in a variant, it is possible to deposit the thin resin layer first of all on the surface of the support concerned and then to print the resin. This latter variant is, however, delicate given that it is difficult to avoid the inks spreading slightly during the assembly step, in particular by lamination where a certain amount of thermal energy is transmitted to the thin resin layer.

The method according to the invention has several advantages. First of all, it can produce inlays that incorporate thicker electronic units than the prior art for fabricating cards with at least one high quality printed pattern protected by a transparent coating. Two different cases can be differentiated, where the thick sheet according to the invention brings a significant advantage. In the first case, a card body with a greater thickness can incorporate higher electronic elements than those that could be integrated in a method of the prior art. In the second case, for a given electronic unit or module, the quantity of material covering the top and bottom surfaces of the electronic elements is greater than in the case of a method according to the prior art. Thus, the thickness of the material forming the thick layer above and below the electronic elements is greater, which more easily enables a perfectly flat surface state to be obtained for quality printing. Indeed, the flatness of the printed sheet is important for obtaining perfect reproduction of the printed pattern.

As already stated, when the thickness of the material covering the electronic elements is too small, the electronic elements generally generate some waviness at the card body surface. This is particularly the case when the sheet that defines the card bodies is obtained by pressing at least two plastic sheets between which the electronic elements are placed. When these electronic elements penetrate the softened plastic layers, the material is deformed to allow the electronic elements to be housed or embedded in the plastic layers, which causes internal tensions or stress in the material forming the layers. When the sheets forming the card bodies are removed from the press, a slight bump is likely to appear in the areas where the electronic elements are located, especially when there is only a small thickness covering the electronic elements.

The method according to the invention thus increases the thickness of material covering the electronic elements and produces a better surface state for the thick sheet, which then exhibits a good level of flatness and forms a good printing support. Moreover, this thick sheet will remain more stable during the final assembly step with the at least partially transparent outlay. This major advantage is further reinforced by another major advantage of the methods according to the invention, namely the assembly step after the printing steps consists only in assembling the thick sheet forming the card bodies to relatively thin outlays. This assembly can thus be achieved by lamination at a relatively low temperature for a relatively short time, i.e. with a limited supply of energy.

The outlays are generally stabilised by the surfaces of the press and the only central layer is formed by the thick sheet, which will not undergo any perceptible deformation with the small amount of energy necessary for this final lamination step. This latter advantage is already very significant as regards the method of the prior art, which required a larger supply of energy given the presence of the two intermediate sheets used as printing supports. Thus, the fact of printing directly on the sheet that incorporates the electronic elements, which, within the scope of the invention, has a greater thickness, means that the two separately printed intermediate layers can be omitted and also ensures that the quality of the printed patterns is not reduced during the final assembly step where these printed patterns where the printed patterns are protected by a transparent outlay.

Another important advantage concerns the fabrication of cards that have back-to-back prints. Since the first pattern and the second pattern are printed on either side of the thick sheet, it is relatively easy to ensure the relative position of these two patterns. Moreover, during final assembly, this position will remain stable. This is not the case in the prior art where the two patterns are respectively printed on two intermediate layers, which requires precise relative positioning during final assembly and the relative position may vary during the final assembly step, given that the intermediate sheets may move quite easily as they are arranged between the inlay and the transparent outlay.

Another interesting advantage of the invention will also be noted: In order to allow plastic layers to be properly laminated, those skilled in the art preferably choose layers with matt surfaces, i.e. with a micro relief. Thus, in the method of the prior art described in the introduction, printing is generally performed on such matt plastic sheets. This surface state limits the definition possible for the printed pattern. However, within the scope of the present invention, when the first pattern is printed on the thick sheet, the latter may have smoother surfaces. This thick sheet needs only to be made, at least in a final step, in a press that has smooth surfaces. The thick sheet that results from the methods according to the invention can thus be perfectly smooth and flat, which means that very fine and very small characters or patterns can be printed, i.e. a very high definition print can be obtained.

Within the scope of the improved method, the invention is very advantageous, since first of all a thick layer is fabricated, incorporating the electronic elements. As mentioned above, this thick layer may have flat, uniform surfaces. Moreover, the thick layer is stable since it has a minimum of internal residual tensions compared to the inner layers of the prior art. Thus, this thick layer forms a very good support for high definition printing by the card manufacturer or printing specialist. A thick sheet is thus obtained that incorporates the electronic elements and has, in particular, very high quality patterns on both sides, in particular at least one security pattern. In order to obtain the finished cards, all that is missing from the thick printed sheet are the transparent protective coatings. Transparent films can be printed in a relatively simple and inexpensive station, and then assembled easily with the thick sheet, particularly via a small supply of energy; which ensures that the printed patterns are not damaged during this final assembly. Printing on the transparent outlays and assembly of the outlays with the thick sheet can thus be performed using less complex and less expensive stations and by less qualified personnel. These steps can be achieved at other locations by the client with stations that belong to him.

In summary, during final lamination or bonding after printing, the fact of having only one central thick sheet, which is not deformed locally or overall in the presence of a small supply of energy, and two relatively thin outlays between which the sheet is arranged, constitutes a major advantage that guarantees fabrication of cards that have very high quality prints, which are not likely to be damaged during said lamination or final bonding. This means that industrial efficiency or yield can be increased and printing on the transparent outlays and the assembly thereof to the central thick sheet can be performed at other locations in different manufacturing sites to those where the thick sheets are made and the high quality prints are performed on the surfaces of the sheets.

The invention also concerns an intermediate or semi-finished product involved in the fabrication of cards according to the invention. This intermediate product is formed by a sheet that incorporates or embeds a plurality of electronic units and defines a respective plurality of card bodies, said sheet having on a first surface a plurality of first printed patterns.

In an advantageous variant, said plurality of first patterns is covered by a protective coating, in particular by a plastic film, a resin layer or a lacquer. It should be noted that the lacquer could be, for example, a sort of transparent ink deposited with the aid of a transfer film.

In a first case, the protective coating is temporarily arranged on the thick sheet. It is thus not very adherent to the sheet and can therefore be removed.

In a second case, the protective coating adheres securely to said sheet and is thus intended to form an at least partially transparent layer for cards fabricated from this intermediate product.

In a particular variant, the first patterns define high definition security patterns, particular print elements or characters that are virtually imperceptible to the naked eye.

The invention concerns finally a plate obtained during implementation of the improved method of the invention. This plate includes a thick sheet or layer that incorporates or embeds a plurality of electronic units and defines a respective plurality of card bodies. The sheet has, on a first surface, a plurality of first printed patterns. The plate further includes a first at least partially transparent film arranged on said first surface of said thick sheet or layer and has a plurality of second patterns printed on its inner surface, each card body being associated with a first pattern and a second pattern, which are located at approximately the same level of the card.

In a particular variant, said plurality of first patterns and said plurality of second patterns are separated from each other by a thin, at least partially transparent layer forming an adherence interface.

In a preferred variant, the first patterns define high definition security patterns and the second patterns define, in part, personal data.

In another variant, the plate has, on the side of its second surface, at least one plurality of third printed patterns protected by an at least partially transparent coating.

BRIEF DESCRIPTION OF THE DRAWINGS

The present invention will be further described below with reference to the annexed drawing, given by way of non-limiting example, in which.

DETAILED DESCRIPTION

Figure 2:
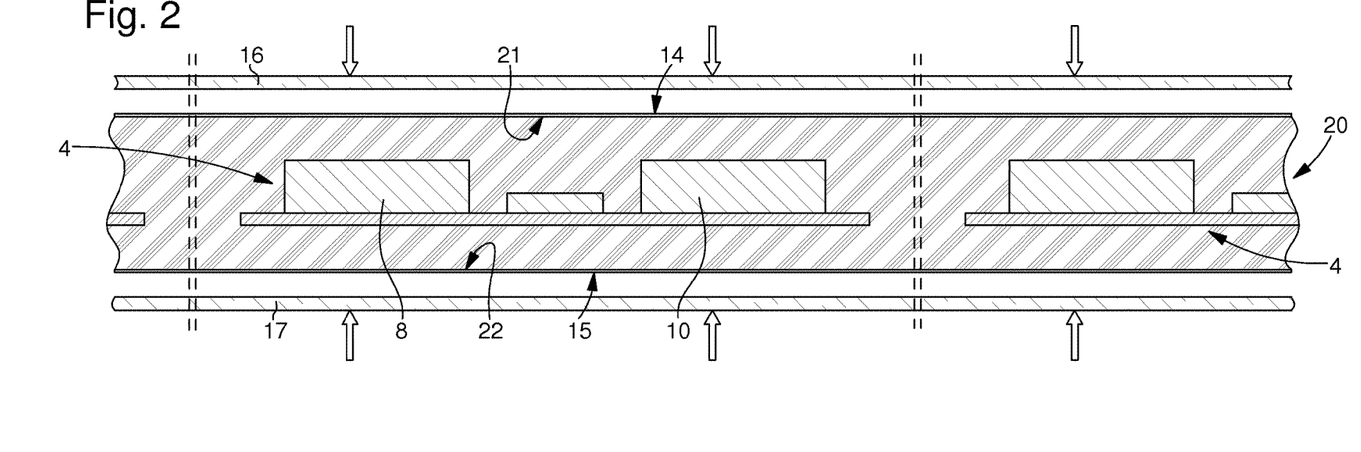
FIG. 2 shows schematically a first implementation mode of the card fabricating method according to the invention.

The first implementation mode of the method according to the invention show in FIG. 2 is characterized in that a thick sheet 20, which incorporates or embeds a plurality of electronic units 4, is first of all formed. This thick sheet 20 defines a plurality of card bodies each including an electronic unit 4.

The thick sheet 20 can be made by any technique known to those skilled in the art, particularly using several layers laminated or bonded to each other. In a variant, at least one central layer has apertures, which house at least electronic elements 8 and 10. In another variant, electronic unit 4 is incorporated in a press where plastic layers are first of all softened sufficiently and then pressed in a controlled manner so that electronic unit 4 penetrates these layers to form its own housing. Thick sheet 20 can, in another variant, be obtained by pouring or injecting a liquid resin.

Preferably, flat surfaces 21 and 22 of thick layer 20 are opaque, and in particular, white. However, some areas of these surfaces can have other colours or be transparent to reveal, at a lower level, any type of display, a logo or a hologram. Partial printing on these transparent areas may be envisaged, particularly for security purposes.

When thick layer 20 is being formed, surfaces 21 and 22, which are very flat and preferably smooth in appearance, are obtained. Since the thickness of thick sheet 20 is greater than that of the inlay of the prior art shown in FIG. 1, the presence of electronic module 4 inside layer 20 scarcely affects the state of surfaces 21 and 22 if those skilled in the art can master the technique used to form layer 20. It will be noted that the thickness of the material forming thick layer 20 above and below electronic elements 8 and 10 is much greater than that of inlay 2 of FIG. 1. The surface waviness of inlay 2 of the prior art is not present again after thick layer 20 has been formed in accordance with the invention by the same technology.

Figure 5:
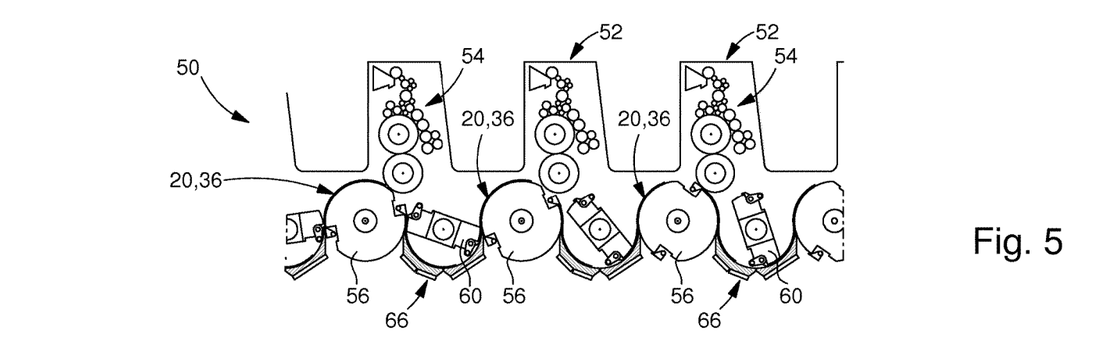
FIGS. 5 and 6 shows schematically an Offset printing station preferably used for printing the thick sheets according to the invention.
Figure 6:
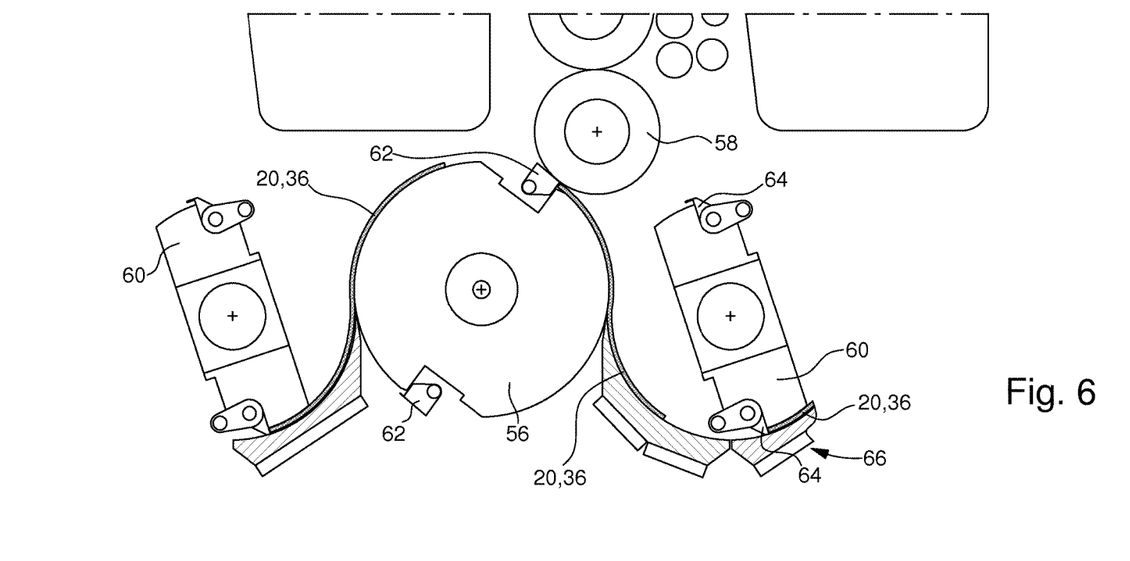

According to the method of the invention, first patterns 14 and, in the variant described here, second patterns 15 are respectively directly printed on the two surfaces 21 and 22 of thick layer 20. In order to do this, thick sheet 20 is introduced into a printing station. Preferably the printing station is arranged for high definition printing that can produce very good quality patterns, in particular with characters or signs that are barely perceptible to the naked eye. A preferred printing station for printing the first and second patterns on thick layer 20 is shown in FIGS. 5 and 6 and will be described below.

Once the first and second patterns 14 and 15 have been printed on each side of thick sheet 20, these printed patterns are protected, in a particular variant, by two at least partially transparent films 16 and 17. These films 16 and 17 are thus added either side of the thick sheet 20 and assembled thereto by lamination or bonding in a press (for example with flat pressure surfaces or continuous press by cylinders or belts). This assembly step requires little or no thermal energy so that it is easily possible to ensure the stability of thick sheet 20, i.e. to prevent any deformation of its surfaces 21 and 22. Thus, within the scope of the invention, the printed patterns are not liable to be damaged by the final step of assembling the layers. Finally, the cards are cut into the resulting plate along the dotted vertical lines in FIG. 2.

In the case of formation of a bank card, i.e. a card with an ISO thickness of between 0.76 and 0.84 mm, the thickness of thick layer 20 is between 600 and 720 microns, for example and the thickness of each transparent outlay 16, 17 is between 60 and 80 microns. Generally, according to the invention, the thickness of thick layer 20 is preferably approximately equal to or greater than the two thirds the final thickness of the fabricated cards. In the particular example given above, the thickness of thick layer 20 is approximately equal to or greater than 600 microns (0.60 mm).

If thick layer 20 is formed in a laminating press with a supply of heat to form a compact layer, the amount of energy necessary for the step of forming this thick layer 20 is considerably greater than the small amount of energy necessary for laminating outlays 16 and 17, which have a small thickness compared to the thickness of layer 20.

In a particular variant, a thin resin layer is added to surfaces 21 and 22 of thick layer 20 our to the inner surfaces of transparent layers 16 and 17. Selected in an appropriate manner, this resin layer defines an adherence layer which, particularly in the presence of inks forming printed patterns 14 and 15, increases the adherence of the laminated layers and thus the solidity of the assembly of layer 20 with films 16 and 17.

Generally, the assembly of the transparent films to the thick layer or the addition of a coating to each printed pattern is achieved so as to ensure that the film or coating adheres properly to the corresponding card body, i.e. to the thick sheet. Thus, the selection of inks and/or materials used may be of some importance. As mentioned above, the presence of an adherence interface, generally formed by a thin resin layer or any lacquer, can ensure a solid and durable assembly of the transparent outlays with the thick central sheet.

The use of the term thick layer or thick sheet does not mean that this thick layer or sheet cannot be formed of a plurality of sub-layers formed of the same materials or different materials. Thus, thick layer 20 may be formed of various materials and several sub-layers according to a method known to those skilled in the art. What is important is that the thick layer or sheet 20 forms a support that can receive printing of a plurality of patterns on at least one of its surfaces.

Figure 3:
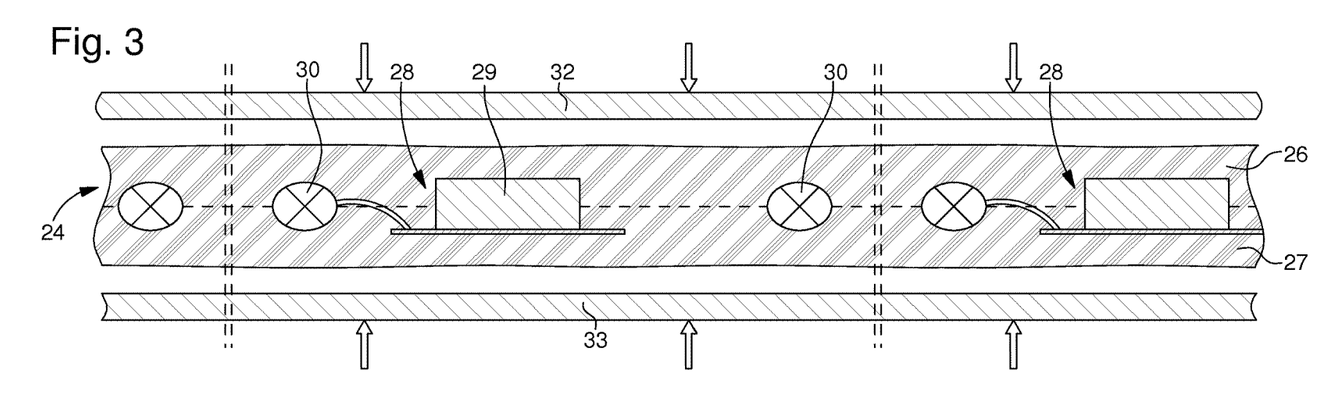
FIG. 3 shows an advantageous embodiment of a thick sheet incorporating a plurality of electronic units.

FIG. 3 shows an improved variant of a thick sheet formed according to the invention. In a first step, an inlay 24 is made in a laminating station with two plastic layers 26 and 27 between which a plurality of electronic units 28 are arranged, in particular communication units including an integrated circuit 29 connected to a coil or antenna 30. Layers 26 and 27 are softened and pressed so as to embed electronic units 28 in the inlay 24 thereby formed as well as possible. Given that layers 26 and 27 have to be significantly deformed in the area of integrated circuit 29 and coil 30, with a displacement of material resulting from these two elements penetrating the two layers, some waviness often appears at the surfaces of inlay 24 in the areas where these electronic elements are located.

It will be noted that in other variants, other electronic units or modules can be incorporated in an inlay 24, which may be formed by various techniques known to those skilled in the art. It will also be noted that at least one electronic element can be approximately flush with at least one surface of the inlay 24.

In order to obtain a thick layer according to the invention that has flat, uniform surfaces, in order to have a very high quality printing support, two, preferably opaque, white layers 32 and 33 are arranged on either side of inlay 24 and the assembly is placed in a laminating station to form a multi-layered structure 36. In this second step of forming thick layer 36, given that no pattern is then printed at the surfaces of layers 32 and 33, enough energy can be supplied to reduce any residual internal tensions or stress in inlay 24 and to slightly deform layers 32 and 33 to compensate for any waviness present at the surfaces of inlay 24, if necessary.

This variant of forming thick layer 36 has various advantages. Inlay 24 can be made at a low cost without it being necessary to have properly flat surfaces at this stage. Next, inlay 24 can have non homogenous surfaces with different materials, in particular it may have at least one electronic element that is approximately flush with its surface. In particular, inlay 24 may be formed of transparent or translucent materials that are not suitable for high contrast, quality printing. In a variant, inlay 24 is formed by a resin initially added in a viscous liquid state to coat or embed electronic unit 28 and thus form a compact layer with little or no internal residual tension or stress.

Figure 4:
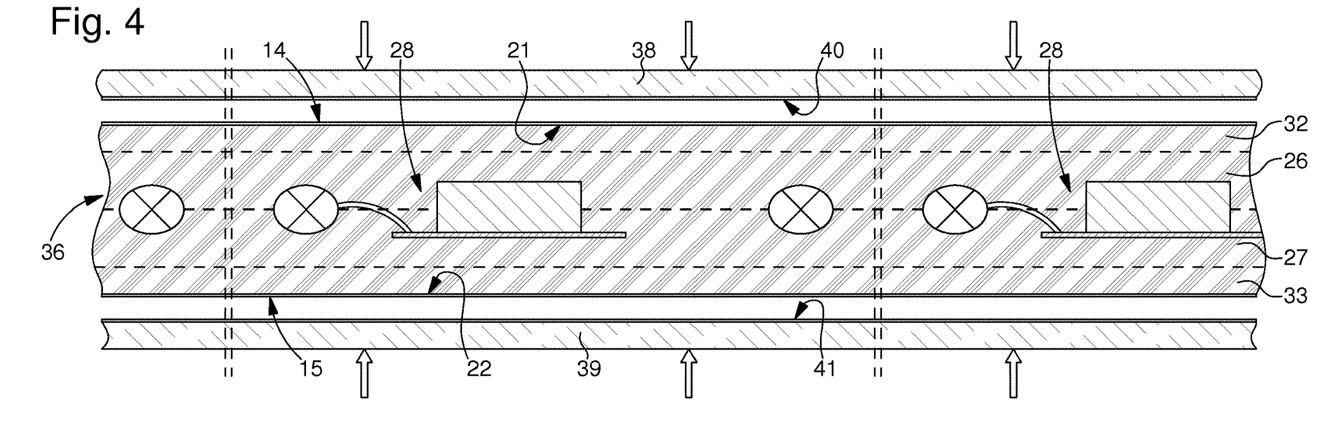
FIG. 4 shows schematically a second implementation mode of the card fabricating method according to the invention.

Adding the two layers 32 and 33 and assembling these two layers to inlay 24 in a laminating station provides a thick layer 36 that has flat smooth surfaces, thus defining, on each side of thick sheet 36, a uniform printing surface with homogenous behaviour in the printing station and finally, during the last step where two outlays 38 and 39 are added to either side of this thick sheet and are assembled thereto by lamination or bonding, as shown schematically in FIG. 4. By way of example, the thickness of inlay 24 is between 400 and 500 microns and the thickness of coating layers 32 and 33 is between 80 and 100 microns. Preferably, the thicknesses are selected so as to obtain a thick sheet 36 with a thickness of between 600 and 720 microns.

In the improved method described with reference to FIG. 4, as in the basic method according to the invention, a plurality of first patterns 14 is printed on the surface 21 of thick sheet 36 in a station in order to obtain high definition printing. Next, a second plurality of patterns 40 is printed on an at least partially transparent film 38 that has, for example, a thickness of between 80 and 100 microns. In the variant shown in FIG. 4, third patterns 15 are also printed on surface 22 of thick sheet 36 and fourth patterns 41 are printed on a second at least partially transparent outlay 39. In a particular variant, only the third patterns 15 are provided on the side of surface 22 of thick sheet 36, whereas in another variant, only the fourth patterns 41 printed on film 39 are provided on the side of surface 22. Preferably, the thickness of film 39 is approximately equal to that of film 38.

After the aforementioned set of patterns has been printed, films 38 and 39 are assembled to thick sheet 36 with the plurality of patterns 40 and, if necessary, the plurality of patterns 41 arranged on the inner surface of the corresponding film, i.e. the printed surfaces of film 38 and, respectively, film 39 are located on the side of the thick sheet 36, so that outlays 38 and 39 form protective coatings for the printed patterns. This final assembly is performed by lamination or bonding with a small supply of energy, or without any heat. The first and second printed patterns are thus located at approximately the same level, which gives a better visual appearance and better reading contrast for the two patterns.

In a preferred implementation, after printing first patterns 14 and, where appropriate, third patterns 15 on the surfaces of thick sheet 36, the printed surface(s) are covered with a protective film, resin layer or lacquer to protect the printed patterns at least temporarily. This is achieved as soon as possible after the patterns are printed on sheet 36.

In a first variant, the protective film or lacquer are arranged in a removable manner and are removed prior to the final assembly step shown in FIG. 4. They therefore have a temporary protective function between the moment when sheet 36 is printed in a suitable station and the assembly step with outlays 38 and 39, of which at least the first also has a plurality of printed patterns.

In a second variant, the protective film or lacquer added to the surface of thick sheet 36 remain securely assembled thereto and thus form finished card layers. In such case, the material forming this protective film or lacquer will be selected to form an adherence interface between thick sheet 36 and films 38 and 39. As in the basic method described above, in each of the variants one can also deposit a thin resin layer between thick film 36 and outlays 38 and 39 to increase the adherence of the outlays. An adherence interface between the first and second superposed patterns in the finished cards can, in some cases, considerably increase the adherence of the outlays to the central thick layer, given the presence of inks forming the printed patterns, which, in some cases, do not adhere well either to the thick sheet, or to the outlay.

It will be noted here that outlays 38 and 39 are added to thick sheet 36 or that a plurality of distinct films, which each have a pattern printed on one surface, are respectively added to a plurality of card bodies formed by the thick sheet. In both cases, this operation is preferably performed prior to the final cutting of the cards in the plate produced. However, in a variant, it is possible for the card bodies to be cut in the thick sheet and then the plurality of outlays, each including a pattern printed on one surface, to be respectively added to the card bodies thereby obtained and assembled thereto in a card by card method. In this latter case, a final card contour can be cut again to obtain a clean edge. Preferably, this final contour is performed inside the initial contour of the cut card body.

The thick sheet 36 thus forms a developed intermediate product or a semi-finished in the card fabrication according to the invention. The fabrication of thick sheet 36 requires know-how peculiar to some card producers. As mentioned previously, forming a thick layer whose thickness is equal to or greater than two thirds of the final thickness of the cards, means that one can obtain, via a suitable method, perfectly flat and preferably smooth surfaces, which form an excellent printing support. Thus, in particular, at least one pattern is printed on a first surface of thick sheet 36 in a printing station for performing high definition printing. In order to do this, the invention proposes introducing thick sheet 36 directly into the printing station. According to a preferred variant of the invention, thick sheet 36 is introduced into an Offset type printing station or similar in which printing is performed on cylinders.

Next, in the improved method according to the invention, an at least partially transparent film 38, which has second printed patterns on its inner surface, is added to the first surface of thick sheet 36 where the first patterns are printed. The thick sheet is preferably assembled with film 38 prior to cutting the cards in the resulting plate. In a more elaborate variant, as shown in FIG. 4, third patterns are printed on the second surface of thick sheet 36 and fourth patterns are printed on the inner surface of a second film covering the third patterns. One may have various variants however, and for example provide cards with a back side that has a single printed pattern. In particular, if the pattern provided on the back side of the card has a general nature and is common to the batch of plate fabricated cards, printing will preferably be performed on the second surface 15 of thick sheet 36.

Printing on second surface 22 may, in a particular variant, define only a uniform background in a certain colour. If only the third patterns are provided on the back side of the card and these are printed on the second surface of the thick sheet, it is not then necessary to provided an outlay, but one could provide only a lacquer or a transparent ink deposited using a transfer film. This lacquer of transparent ink defines a protective coating for the third printed patterns. It will be noted that the final passage into a laminating press to assemble, particularly by bonding, the thick sheet with the transparent film added to the first surface of said thick sheet may also be used for improving the surface state of the lacquer or transparent protective ink previously added to the back of the thick sheet. This final assembly step may thus enable a smooth brilliant surface to be obtained on the back of the card without adding an outlay. However, it will be noted that it is preferable to provide a symmetrical multi-layered structure if heat is to be used for the final assembly.

The plate obtained for the improved fabrication method forms a subject of the invention, just like the cards that are then cut into the plate.

The fabrication of an intermediate product or semi-finished product in the form of a thick sheet 36 that incorporates the electronic units and has on at least one of its surfaces a plurality of first patterns, which may or may not be protected by a film or lacquer, has a significant advantage particularly for fabricating identity cards, driving licenses or any other official documents that include personal data. The personal data is generally protected by the State that delivers the identity cards, driving licenses or other documents of an official nature. For reasons of confidentiality and protection of personal data, it is possible that some States will not wish to transmit the data to a card producer located abroad. However, since the fabrication of cards incorporating electronic units and having, for security reasons, high definition patterns that are difficult to reproduce, cannot always be performed in the country concerned, the present invention provides an efficient solution to this problem.

Indeed, it is possible, according to the invention, to make the cards in two distinct steps. First, the thick sheet that includes the electronic units and has very high quality flat surfaces is manufactured and at least one plurality of security type patterns are printed, in accordance with the invention, on one surface of said thick sheet. Printing these security patterns requires relatively complex and expensive means and a particular know-how. Thus, the operations requiring specific know-how and complex, expensive production means may be performed elsewhere at one of the few producers able to make this intermediate product. Secondly, variable and/or personal data can be printed by the client, particularly a given State, inside the borders of the State. The personalised patterns do not generally require high definition and can thus be performed in conventional printing stations, which are less complex and less expensive, on a transparent plastic film which is then laminated with the thick sheet according to the invention. In this second phase, the client can continue to fabricate cards in plates or finish the cards in a card by card station. In such case, he can receive printed and pre-cut card bodies in the intermediate product according to the invention.

As already mentioned, transparent film is preferably added and assembled to the thick sheet prior to cutting out the batch of cards. However, it is possible to envisage doing this card by card after having cut the plurality of card bodies in the thick sheet. This latter variant is less advantageous and raises a problem of quality for the finished card, particularly as regards the edge of the card. This is why, within the scope of the present invention, the preferred solution consists in assembling the printed thick sheet with the at least partially transparent, printed film prior to cutting the cards in the resulting plate.

Any programming of the electronic units can be performed in various ways and at various times. Some data may be introduced during manufacture of the electronic units, other data may be programmed after manufacture of the thick sheet and other data may also be introduced by the client, particularly by the State concerned in the case of identity cards, driving licenses or even bank cards, after he has received the printed thick sheets. The pattern printed on the transparent film may depend upon the content of a memory arranged in the electronic unit, which is read to generate the printed pattern. Each electronic module can thus have a unique number or personal code and each personalised pattern printed on the transparent film has at least one variable item of data relative to the unique number or personal code of the corresponding electronic unit. The transparent film is then added to the thick sheet so that the first personalised patterns are placed opposite the corresponding electronic units. The management of these steps and the entry of the various data are achieved using computer means known to those skilled in the art.

The at least partially transparent films 38 and 39 may be laminated with thick sheet 36 with a small supply of energy relative to the amount of energy used to form thick sheet 36.

The final assembly may be achieved under a relatively simple press without requiring any great know-how. Outlays 38 and 39 are relatively thin compared to thick sheet 36, which remains stable and is not deformed during this step. Outlays 38 and 39 are generally stabilised by the surfaces of the press. As already mentioned, it is possible to provide an adherence interface, in the form of a thin resin layer, a lacquer or even a transparent ink, selected for its adherence features to the materials of the thick sheet and outlays. The client can thus easily make finished cards of very high quality with high definition printed patterns; which thus allows a reliable official title that is difficult to reproduce.

With reference to FIGS. 5 to 6, we will describe below an Offset type high definition printing station, provided in a preferred variant for printing patterns on at least one of the surfaces of thick sheets 20, 36. This is not a detailed explanation of the printing station which is known to those skilled in the art in this field. This is rather to show the path of thick sheets 20, 36 in this printing station. The station includes a plurality of printing units 52 arranged for printing a different base colour on sheets 20, 36 for each of units 52. To do this, each unit includes a plurality of inking rollers 54 shown schematically. A cylinder 56 used as a support for the thick sheet is associated with each printing unit 52. Sheet 20, 36 is spread out in succession over each of these cylinders 56, which drive the sheet synchronously with an end inking roller 58. Between two adjacent cylinders 56, there is a rotating device 60 for transferring the sheets between the various printing units. Gripping means 62 and 64 are respectively arranged on cylinders 56 and on the rotating devices 60. These gripping means are used for pulling the thick sheets 20, 36 and driving them in rotation with cylinder 56, respectively rotating transfer device 60. It will be noted that thick sheets 20, 36 are thus bent several times in this Offset printing station. On printing cylinders 56, the sheets are bent in a convex way, whereas they are bent in a concave way in transfer zones 66. It is thus clear that thick sheets 20, 36 undergo mechanical stress in the printing station where they are momentarily bent. These stations are provided for printing simple, homogenous sheets. The use of these printing stations within the scope of the present invention goes against the prejudices of those skilled in the art and enables clean, high definition printing, particularly of security patterns, directly onto a thick sheet incorporating various electronic units.

The invention claimed is:

1. An intermediate product involved in a fabrication of electronic cards and comprising:

a thick sheet incorporating or embedding a plurality of electronic units and a protective coating, the thick sheet defining a respective plurality of card bodies and having on a first surface a corresponding plurality of first patterns printed with an ink, wherein the plurality of first patterns is covered with the protective coating having a temporary protective function, the protective coating being arranged in a removable manner on the first surface of the thick sheet so that this protective coating has to be removed prior to assembly m the fabrication of the electronic cards, wherein an outlay or a plurality of outlays is/are brought on the plurality of card bodies over the plurality of first patterns and firmly assembled to this plurality of card bodies, and wherein a second surface of the thick sheet or an inner surface of the outlay or the plurality of outlays is printed with a plurality of second patterns, the first patterns being of higher definition than the second patterns.

2. The intermediate product according to claim 1, wherein the first patterns are of the offset type and define high security patterns substantially imperceptible to the naked eye.

\* \* \* \* \*